(12) United States Patent
Tong et al.

(10) Patent No.: US 12,416,514 B2
(45) Date of Patent: Sep. 16, 2025

(54) MULTIPARAMETER INTEGRATED ONLINE MONITORING SYSTEM AND METHOD FOR AT LEAST ONE ENERGY STORAGE BATTERY BASED ON FIBER BRAGG GRATING

(71) Applicant: Wuhan Unviersity of Technology, Wuhan (CN)

(72) Inventors: Xinglin Tong, Wuhan (CN); Shimeng Chen, Wuhan (CN); Cui Zhang, Wuhan (CN); Yan Mao, Wuhan (CN); Xuzhi Chen, Wuhan (CN); Wenzhong Huang, Wuhan (CN); Meng Li, Wuhan (CN); Xianyu Li, Wuhan (CN); Te Zhang, Wuhan (CN)

(73) Assignee: Wuhan Unviersity of Technology, Wuhan (CN)

( * ) Notice: Subject to any disclaimer, the term of this patent is extended or adjusted under 35 U.S.C. 154(b) by 760 days.

(21) Appl. No.: 17/725,505

(22) Filed: Apr. 20, 2022

(65) Prior Publication Data

US 2022/0412777 A1 Dec. 29, 2022

(30) Foreign Application Priority Data

Jun. 29, 2021 (CN) .......................... 202110724258.6

(51) Int. Cl.
*G01D 5/353* (2006.01)
*G01R 31/3842* (2019.01)
*H01M 10/48* (2006.01)

(52) U.S. Cl.
CPC ..... *G01D 5/35316* (2013.01); *G01R 31/3842* (2019.01); *H01M 10/482* (2013.01); *H01M 10/486* (2013.01)

(58) Field of Classification Search
CPC ............ G01D 5/35316; H01M 10/482; H01M 10/486; G01R 31/3842
See application file for complete search history.

(56) References Cited

U.S. PATENT DOCUMENTS

2007/0280601 A1* 12/2007 Mendoza ........... G01D 5/35383
385/37
2007/0280605 A1* 12/2007 Mendoza ........... G02B 6/12007
385/92

(Continued)

FOREIGN PATENT DOCUMENTS

CN 110308403 A * 10/2019 ........... G01B 11/161

OTHER PUBLICATIONS

Machine Translation of CN-110308403-A (Apr. 2, 2025) (Year: 2025).*

*Primary Examiner* — Matthew J Merkling
(74) *Attorney, Agent, or Firm* — Hemisphere Law, PLLC; Zhigang Ma

(57) ABSTRACT

A multiparameter integrated online monitoring system and method for at least one energy storage battery based on Fiber Bragg grating (FBG) are provided. The system includes multiple sensors based on the FBG including a temperature, a strain, a pressure, a current, a voltage and a gas sensor, a FBG demodulator, a computer, and transmission optical fibers. The multiple sensors are connected in series on one transmission optical fiber and can be multiplexed to establish the multiparameter integrated and distributed optical fiber sensing monitoring network from single battery to module, or from single battery to cluster, or from single battery to energy storage system. The system has advantages of simple structure, small occupied space, anti-electromagnetic interference, corrosion resistance, multiparameter integration and distributed simultaneous measurement. It can (Continued)

monitor the status of the multiple parameters in real time, so as to judge the charge, health status and remaining life of the battery.

3 Claims, 2 Drawing Sheets

(56) References Cited

U.S. PATENT DOCUMENTS

| | | | | |
|---|---|---|---|---|
| 2015/0069996 A1* | 3/2015 | Imaoka | G01R 15/22 | |
| | | | 385/13 | |
| 2015/0280290 A1* | 10/2015 | Saha | H01M 10/4257 | |
| | | | 324/426 | |
| 2018/0248233 A1* | 8/2018 | Schade | G01K 11/32 | |
| 2018/0321325 A1* | 11/2018 | Fortier | H01M 10/48 | |
| 2023/0144563 A1* | 5/2023 | Ben Saad | H01M 10/486 | |
| | | | 374/143 | |
| 2024/0019405 A1* | 1/2024 | Guo | G01N 29/2418 | |

\* cited by examiner

MULTIPARAMETER INTEGRATED ONLINE MONITORING SYSTEM AND METHOD FOR AT LEAST ONE ENERGY STORAGE BATTERY BASED ON FIBER BRAGG GRATING

TECHNICAL FIELD

The disclosure relates to the field of monitoring equipment for multiparameter state in an energy storage battery, particularly to an optical fiber sensing online monitoring system and method based on a Fiber Bragg Grating (FBG) array sensing technology with an ultra-low reflectivity.

BACKGROUND

As a clean energy battery, energy storage batteries, especially lithium-ion batteries (also referred to as lithium batteries), have been widely used in electric vehicles, large energy storage power stations and other industries because of their advantages such as high energy density, high conversion efficiency, low self-discharge rate and long service life. In recent years, many safety accidents of an energy storage battery system have occurred at home and abroad, resulting in serious economic losses and social impact. The research on monitoring methods of multiple parameters such as temperature, strain, pressure, current, voltage, gas composition and concentration of the energy storage battery is of great significance to the evaluation and early warning of safety state of the energy storage battery system and the control and protection of accident risk.

During the charging and discharging process, the temperature of the energy storage battery will gradually rise, and the temperature change at the positive and negative tabs is more significant. When the battery has thermal runaway behavior, its internal temperature will rise sharply, and there is a high risk of burning the battery. Therefore, monitoring the temperature state in the battery can give early warning of the thermal runaway, which can effectively prevent the occurrence of battery safety accidents. An insertion and removal stress of ions in the battery during the insertion/removal of positive and negative electrodes and a thermal stress caused by inconsistent temperature distribution will deform a cell of the battery. When the deformation reaches a certain degree, a diaphragm of the battery may break, resulting in the safety problem of internal short circuit. Therefore, monitoring the deformation in the battery is helpful to prevent such safety accidents. Some gases will be produced during the use of the energy storage battery, such as hydrogen, methane, carbon monoxide, carbon dioxide and other gases produced by a lithium iron phosphate battery. Due to the narrow and closed internal space of the battery, these gases will produce a certain pressure inside. When the pressure reaches a certain degree, the battery shell may be deformed and seriously affect the service life of the battery, therefore, it is necessary to monitor the internal pressure. When the internal pressure reaches a certain threshold, an air valve is opened to release the internal pressure. In addition, the proportion of gas components produced by the battery varies in different periods. Monitoring the gas concentration is helpful to predict the remaining life of the battery. The battery is often composed of multiple cells in series or in parallel. If the current or voltage between the cells is unbalanced, it will have an adverse impact on the health of the battery. Therefore, monitoring the current and the voltage is helpful to predict the battery state.

In view of the application requirements of sensors in the complex, narrow, closed, corrosive and electromagnetic interference environment inside the energy storage battery, the existing electrical sensors cannot meet this condition, so there is an urgent need to adopt a new sensing technology.

At present, measurement methods of some internal parameters of lithium battery mainly include the following:

1. Chinese patent application No. CN201410773061.1 (corresponding to Chinese patent publication No. CN104485490A), discloses an online flexible package polymer lithium battery pack monitoring system and a monitoring method thereof. The online flexible package polymer lithium battery pack monitoring system monitors the battery condition by a temperature sensor and a resistance strain sensor. However, the temperature sensor and the resistance strain sensor are electrical sensors. The electrical sensor is susceptible to electromagnetic interference, poor corrosion resistance, and cannot be multi-point multiplexed and has other fatal shortcomings. Moreover, the wiring of this method only measuring the temperature and strain is extremely complex and takes up a large space. Therefore, it is not suitable for the measurement of multiple parameters in the lithium battery.

2. XIE ZHAO (XIE ZHAO, "Research and development of high precision parameter detection and SOC estimation equipment for energy storage battery pack [D]", Beijing Jiaotong University, 2020.) discloses a method for measuring the current and voltage of the energy storage battery. The current is monitored by a Hall sensor and the voltage is measured by a resistance voltage dividing network. The system uses CS5463 chip to collect the current and voltage signals. The two sensors used in this method are also the electrical sensors, which still have the fatal shortcomings of the electrical sensor, therefore it is difficult to perform a distributed network monitoring on the energy storage batteries.

At present, there are many literatures on the monitoring of some parameters of the temperature, strain, current and voltage in the energy storage battery, but most of them use the detection methods of the electrical sensors, while there are few detection methods for the pressure and gas concentration in the battery. Because the electrical sensor itself is vulnerable to electromagnetic interference, poor corrosion resistance and difficult to network in multi-point measurement, it is difficult for this kind of sensor to be applied in the complex, narrow, closed, corrosive and electromagnetic interference environment inside the energy storage battery.

SUMMARY

In order to solve the above problems, the disclosure provides a multiparameter integrated online monitoring system and method for at least one energy storage battery based on FBG combining the FBG array sensing technology with the ultra-low reflectivity, according to the requirements of online monitoring of multiple parameters such as the temperature, the strain, the pressure, the current, the voltage, the gas composition and concentration in the complex, narrow, closed, corrosive and electromagnetic interference environment inside the energy storage battery. The multiparameter integrated online monitoring system and method can meet the requirements of miniaturization, corrosion resistance and electromagnetic interference resistance of multiple sensors in the energy storage battery, and establish a multiparameter integrated, multi multiplexed and distributed optical fiber sensing monitoring network from single battery to module, or single battery to cluster, or single battery to energy storage system.

The disclosure adopts the following technical solutions:

A multiparameter integrated online monitoring system for at least one energy storage battery based on FBG, includes: a computer, a demodulator, the at least one energy storage battery, and transmission optical fibers; the at least one energy storage battery is connected to a signal input end of the demodulator by one of the transmission optical fibers, and a signal output end of the demodulator is connected to an input end of the computer. The one energy storage battery is also referred to as a single energy storage battery, and abbreviated as a single battery, In an embodiment, each of the at least one energy storage battery is provided with a temperature sensor, a pressure sensor, strain sensors, a voltage sensor, a current sensor and a gas sensor connected in series on another one of the transmission optical fibers. Therefore, a layout process of multiple sensors inside the single battery is greatly simplified and the space occupied by the multiple sensors is reduced.

In an embodiment, the temperature sensor, the pressure sensor, the strain sensors, the voltage sensor, the current sensor and the gas sensor are FBG sensors. Therefore, each of the temperature sensor, the pressure sensor, the strain sensors, the voltage sensor, the current sensor and the gas sensor has the characteristics of miniaturization, corrosion resistance, anti-electromagnetic interference and high precision.

In an embodiment, in each of the at least one energy story battery, the temperature sensor is adjacent to positive and negative tabs of the energy storage battery, and configured to measure a temperature change at the positive and negative tabs, the strain sensors are arranged on two sides of a position with a largest strain change of a cell of the energy storage battery, the pressure sensor is arranged on a gap between a top shell and the cell with a relatively large internal space of the energy storage battery, and configured to measure an air pressure in the energy storage battery, the voltage sensor is connected to the positive and negative tabs of the energy storage battery, and configured to measure the charge and discharge voltages of two cells, the current sensor is connected to the positive tab and a positive electrode of the energy storage battery or to the negative tab and a negative electrode of the energy storage battery, and configured to measure the charge and discharge currents of the two cells, and the gas sensor is arranged between the top shell and the cell of the energy storage battery, and configured to measure the concentrations of gas components produced by electrolyte reaction.

In an embodiment, a series connection mode from the single battery to module, or to cluster, or to the energy storage system adopts optical fiber connection flanges with sealing. That is, the at least one energy storage battery includes multiple energy storage batteries, and the multiple energy storage batteries are connected in series by at least one of the transmission optical fibers and the optical fiber connecting flanges. Therefore, it will not affect the combination mode of the series or parallel between batteries.

A multiparameter integrated online monitoring method for at least one energy storage battery based on FBG, includes: connecting multiple parameter sensors (multiple sensors) of each of the at least one energy storage battery in series on one transmission optical fiber based on a FBG array sensing technology; collecting multiple signals including a temperature signal, strain signals, a pressure signal, a current signal, a voltage signal, gas composition signals and gas concentration signals by the multiple parameter sensors based on a FBG hybrid multiplexing technology; and demodulating the multiple signals by a FBG demodulator, and transmitting the demodulated signals to a computer. Thus, the multiparameter integrated optical fiber sensing online monitoring system suitable for the complex, narrow, closed, corrosive and electromagnetic interference environment inside the energy storage battery is established. Using the FBG array sensing technology combine with the FBG hybrid multiplexing technology, the multiparameter integrated and distributed optical fiber sensing monitoring network from the single battery to module, or from the single battery to cluster, or from the single battery to energy storage system can be established. These parameters are used to predict the health status, residual charge and residual life of the energy storage battery.

In an embodiment, the FBG array sensing technology is a FBG array sensing technology with an ultra-low reflectivity. The ultra-low reflectivity is a reflectivity less than 0.1%. It can multiplex tens of thousands of gratings on one optical fiber to meet the application needs of large-scale energy storage system with many kinds of monitoring parameters and a large number of point locations.

In an embodiment, the FBG hybrid multiplexing technology includes a hybrid multiplexing technology combining a wavelength division multiplexing, a time division multiplexing and a space division multiplexing. It can realize the high-capacity and high-speed transmission and processing of many kinds of sensing signals, so as to establish the multiparameter integrated and distributed optical fiber sensing monitoring network from single battery to module, or single battery to cluster, or single battery to energy storage system.

The disclosure relates to the optical fiber sensing system and method applied to the simultaneous online monitoring of multiple parameters in the energy storage battery, in particular to an integrated online monitoring system and method for multiple parameters such as the temperature, the strain, the pressure, the current, the voltage, the gas composition and concentration in the complex, narrow, closed, corrosive and electromagnetic interference environment in the lithium iron phosphate battery with square aluminum shell. The system mainly includes the multiple parameter sensors based on the FBG such as the temperature sensor, the strain sensors, the pressure sensor, the current sensor, the voltage sensor and the gas sensor, the demodulator based on the FBG (also referred to as FBG demodulator), the computer, the transmission optical fibers, etc. Because the multiple parameter sensors are designed based on the FBG, the multiple parameter sensors are connected in series on the same transmission optical fiber and can be multiplexed to establish the multiparameter integrated and distributed optical fiber sensor monitoring network from the single battery to module, or form the single battery to cluster, or from the single battery to energy storage system. The system has the advantages of simple structure, small occupied space, anti-electromagnetic interference, corrosion resistance, integration of the multiple parameters and distributed simultaneous measurement. It can monitor the status of the multiple parameters of the battery in real time, so as to judge the charge, health status and remaining life of the battery.

The beneficial effects of the disclosure are as follows:

The energy storage battery monitoring system (also referred to as the multiparameter integrated online monitoring system) adopts the FBG array sensing technology with the ultra-low reflectivity to connect multiple FBG sensors such as the temperature sensor, the strain sensors, the pressure sensor, the current sensor, the voltage sensor, and the gas sensor in series on the same transmission optical fiber, and then form a multiparameter integrated optical fiber distributed sensing and monitoring network from the single battery to module, or from the single battery to cluster, or from the single battery to energy storage system through the signal transmission system (transmission optical fibers), the demodulation system (FBG demodulator) and the computer, which has the characteristics of simple layout, small occupied space, anti-electromagnetic interference, anti-corrosion, explosion-proof, wide frequency band, low loss and high precision. It can monitor the status of the multiple parameters in the single battery of the energy storage system in real time, predict the health status, residual charge and residual life of the battery, improve the efficiency, safety and stability of the operation of the energy storage system, give early warning of potential safety hazards in advance, and prevent the occurrence of safety accidents.

DESCRIPTION OF REFERENCE NUMERALS

1—computer, 2—demodulator, 3—single energy storage battery, 4—transmission optical fiber, 31—right cell, 32—left cell, 33—positive electrode, 34—negative electrode, 35—explosion proof valve, 36—right optical fiber connecting flange, 37—left optical fiber connecting flange, 301—temperature sensor, 302—pressure sensor, 303—strain sensor, 304—voltage sensor, 305—current sensor, 306—gas sensor, 307—internal transmission optical fiber, 311—positive right tab; 312—negative right tab; 321—positive left tab.

DETAILED DESCRIPTION OF THE EMBODIMENTS

In order to make the purpose, technical solutions, and advantages of the disclosure clearer, the disclosure is further described in detail below in combination with the accompanying drawings and embodiments. It should be understood that the specific embodiments described are only used to explain the disclosure, but are not used to limit the disclosure. Based on the embodiments of the disclosure, all other embodiments obtained by the people having ordinary skill in the art without creative work will fall within the scope of the disclosure.

Figure 1:
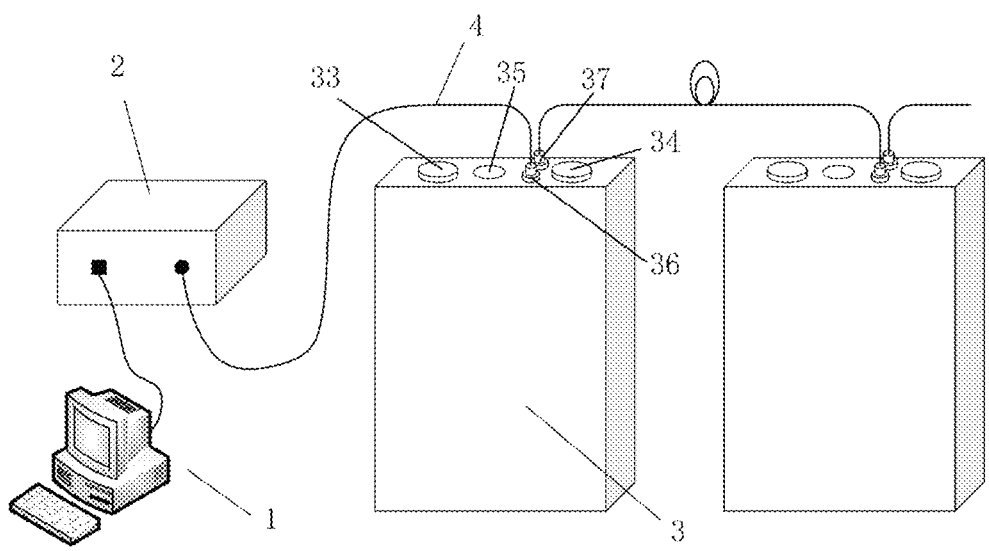
FIG. 1 is a schematic structural view of a multiparameter integrated online monitoring system according to an embodiment of the disclosure.

As shown in FIG. 1, taking a lithium iron phosphate battery with a square aluminum shell as an example, the multiparameter integrated online monitoring system and method for at least one energy storage battery based on FBG mainly includes a computer 1, a demodulator 2, at least one energy storage batteries 3 and transmission optical fibers 4. The demodulator 2 integrates a light source, an optical fiber coupler, an optical detector, a signal demodulator, a data processor, etc. The energy storage battery (also referred to as single energy storage battery) 3 is integrated with multiple types of FBG sensors distributed on a same internal transmission optical fiber. Changes of parameters detected by the multiple types of the FBG sensors are transformed into changes of a central wavelength of the grating. The light detector of the demodulator 2 collects a spectrum containing information of a drift of the central wavelength of the grating. The signal demodulator demodulates the spectrum to obtain a position and wavelength information of the gratin as demodulated signals, and then sends the demodulated signals to the data processor for data processing. The data of the parameters in the energy storage battery can be obtained and displayed on computer 1 in real time.

The large-scale energy storage system is composed of hundreds of single batteries, and each battery needs the multiple sensors. Therefore, in order to meet the needs of thousands of monitoring points of the large-scale energy storage system, the disclosure adopts the FBG array sensing technology with the ultra-low reflectivity to combine with a wavelength division, a time division and a space division hybrid multiplexing technology, which can realize multiparameter integrated and distributed online monitoring of the energy storage system.

FIG. 1 shows an energy storage battery monitoring system with a single channel. The optical fiber connecting flanges including the right optical fiber connecting flange 36 and the left optical fiber connecting flange 37 can connect multiple single batteries through the transmission optical fibers 4, so that signals of the sensors on the whole line will be transmitted on one optical path.

Figure 2:
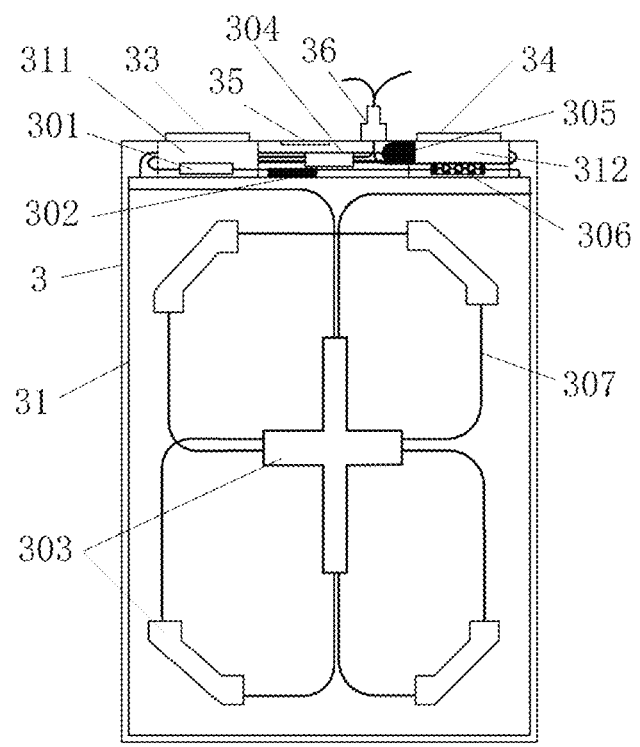
FIG. 2 is a front sectional view of an arrangement of multiple sensors inside an energy storage battery according to an embodiment of the disclosure.
Figure 3:
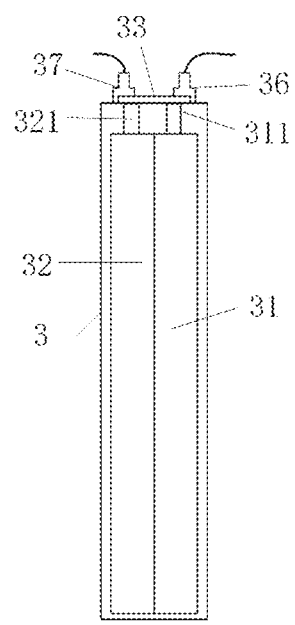
FIG. 3 is a left sectional view of the energy storage battery according to an embodiment of the disclosure.

Combined with FIGS. 2 and 3, it can see the internal structure of the lithium iron phosphate battery with square aluminum shell and the arrangement method of the multi parameter sensors. A temperature sensor 301, a pressure sensor 302, strain sensors 303, a voltage sensor 304, a current sensor 305 and a gas sensor 306 of the battery are connected in series by an internal transmission optical fiber 307, and two ends of the internal transmission optical fiber 307 are introduced and led out by the right optical fiber connecting flange 36 and the left optical fiber connecting flange 37 respectively. The temperature sensor 301 is arranged near the positive right (left) tab 311 and the negative right (left) tab 312 with the most obvious temperature change, and used to measure the temperature change at the tabs. The strain sensors 303 are arranged on the outsides of the right cell 31 and the left cell 32 with the largest strain change. The pressure sensor 302 is arranged on the gap between the top shell and the cell with relatively large internal space of the battery, and used to measure the air pressure of the battery. The current sensor 305 is connected to the positive right (or left) tab 311 and the positive (negative) electrode 33, and used to measure the charge and discharge current of the two cells. The voltage sensor is connected to the positive right (left) tab 311 and the negative right (left) tab 312, and used to measure the charge and discharge voltage of the two cells. The gas sensor 306 is arranged between the top shell and the cell, and used to measure the concentrations of gas components generated by the electrolyte reaction.

The above is only the preferred specific embodiment of the disclosure, but the protection scope of the disclosure is not limited to this. Any change or replacement that can be easily thought of by any person skilled in the art within the technical scope disclosed by the disclosure should be covered by the protection scope of the disclosure. Therefore, the protection scope of the disclosure should be subject to the protection scope of the claims.

What is claimed is:

1. A multiparameter integrated online monitoring system for at least one energy storage battery based on Fiber Bragg Grating (FBG), comprising: a computer, a demodulator, the at least one energy storage battery and transmission optical fibers;
   wherein the at least one energy storage battery is connected to a signal input end of the demodulator by one of the transmission optical fibers, and a signal output end of the demodulator is connected to an input end of the computer;
   wherein each of the at least one energy storage battery is provided with a temperature sensor, a pressure sensor, strain sensors, a voltage sensor, a current sensor and a gas sensor connected in series on another one of the transmission optical fibers; and
   wherein in each of the at least one energy story battery, the temperature sensor is adjacent to positive and negative tabs of the energy storage battery, the strain sensors are arranged on two sides of a position with a largest strain change of a cell of the energy storage battery, the pressure sensor is arranged in a gap between a top shell and the cell of the energy storage battery, the voltage sensor is connected to the positive and negative tabs of the energy storage battery, the current sensor is connected to the positive tab and a positive electrode of the energy storage battery or connected to the negative tab and a negative electrode of the energy storage battery, and the gas sensor is arranged between the top shell and the cell of the energy storage battery.

2. The multiparameter integrated online monitoring system according to claim 1, wherein the temperature sensor, the pressure sensor, the strain sensors, the voltage sensor, the current sensor and the gas sensor are FBG sensors.

3. The multiparameter integrated online monitoring system according to claim 1, wherein the at least one energy storage battery comprises multiple energy storage batteries, and the multiple energy storage batteries are connected in series by at least one of the transmission optical fibers and optical fiber connecting flanges.

\* \* \* \* \*